United States Patent
Miyachi et al.

(10) Patent No.: US 9,739,458 B2
(45) Date of Patent: Aug. 22, 2017

(54) LIGHT-EMITTING DIODE APPARATUS

(71) Applicant: STANLEY ELECTRIC CO., LTD., Meguro-ku, Tokyo (JP)

(72) Inventors: Mamoru Miyachi, Okegawa (JP); Ryosuke Kawai, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 3 days.

(21) Appl. No.: 14/936,501

(22) Filed: Nov. 9, 2015

(65) Prior Publication Data

US 2016/0144771 A1    May 26, 2016

(30) Foreign Application Priority Data

Nov. 25, 2014  (JP) ................................. 2014-237442

(51) Int. Cl.
*F21V 19/00* (2006.01)
*F21V 23/00* (2015.01)
(Continued)

(52) U.S. Cl.
CPC ............ *F21V 19/001* (2013.01); *B60Q 1/143* (2013.01); *F21S 48/1104* (2013.01);
(Continued)

(58) Field of Classification Search
CPC . F21V 19/001; F21S 48/1104; F21S 48/1154; F21S 48/1747
See application file for complete search history.

(56) References Cited

U.S. PATENT DOCUMENTS

2011/0026266 A1* 2/2011 Sasaki .................. F21S 48/1154
                                                            362/516
2011/0074956 A1* 3/2011 Faber ..................... G02B 23/12
                                                            348/148
(Continued)

FOREIGN PATENT DOCUMENTS

EP    1526581 A2    4/2005
EP    2620696 A2    7/2013
(Continued)

OTHER PUBLICATIONS

Extended European Search Report dated Apr. 11, 2016, issued in counterpart European Application No. 15195961.6.

*Primary Examiner* — Anne Hines
(74) *Attorney, Agent, or Firm* — Holtz, Holtz & Volek PC

(57) ABSTRACT

A light-emitting diode apparatus includes a support substrate; and a light-emitting diode array formed of multiple light-emitting diodes arranged two-dimensionally on the support substrate, constituting a light distribution center having a highest brightness in the light-emitting diode array, wherein the multiple light-emitting diodes are divided into a plurality of control units, drive currents of which can be individually controlled, wherein the plurality of control units include a plurality of composite control units in each of which a plurality of light-emitting diodes are connected in series, and wherein among the plurality of light-emitting diodes in each of the composite control units, a light-emitting diode which is positioned farther from the light distribution center has a larger light-emitting area than that of a light-emitting diode which is positioned nearer from the light distribution center.

14 Claims, 6 Drawing Sheets

(51) Int. Cl.
*H01L 25/075* (2006.01)
*B60Q 1/14* (2006.01)
*F21S 8/10* (2006.01)
*F21Y 115/10* (2016.01)

(52) U.S. Cl.
CPC ....... *F21S 48/1154* (2013.01); *F21S 48/1747* (2013.01); *F21V 23/003* (2013.01); *H01L 25/0753* (2013.01); *B60Q 2300/122* (2013.01); *B60Q 2300/41* (2013.01); *B60Q 2300/42* (2013.01); *F21S 48/125* (2013.01); *F21Y 2115/10* (2016.08); *H01L 2924/0002* (2013.01)

(56) References Cited

U.S. PATENT DOCUMENTS

| | | | |
|---|---|---|---|
| 2011/0080753 A1* | 4/2011 | Hering | B60Q 1/20 362/545 |
| 2011/0235356 A1 | 9/2011 | Sato et al. | |
| 2014/0098556 A1 | 4/2014 | Von Malm et al. | |
| 2014/0175978 A1 | 6/2014 | Kobayashi | |

FOREIGN PATENT DOCUMENTS

| | | |
|---|---|---|
| EP | 2752615 A1 | 7/2014 |
| EP | 2778511 A2 | 9/2014 |
| EP | 2796773 A2 | 10/2014 |
| EP | 2911478 A2 | 8/2015 |
| JP | 2010040528 A | 2/2010 |
| JP | 2013054849 A | 3/2013 |

\* cited by examiner

PULSE WIDTH MODULATION

DUTY 10%

DUTY 20%

DUTY 50%

FREQUENCY MODULATION

DUTY 10%

DUTY 20%

DUTY 50%

FIG. 5A
CONVENTIONAL
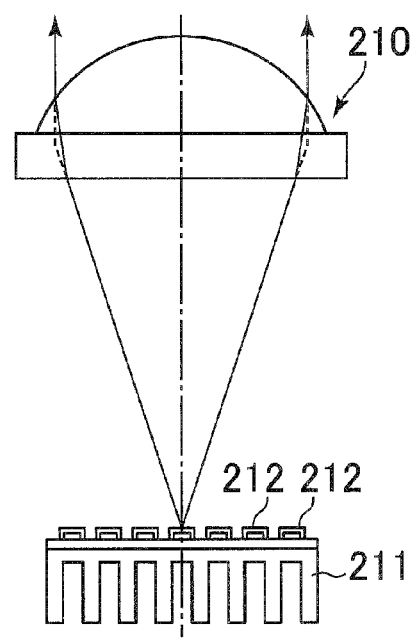
FIG. 5B
CONVENTIONAL
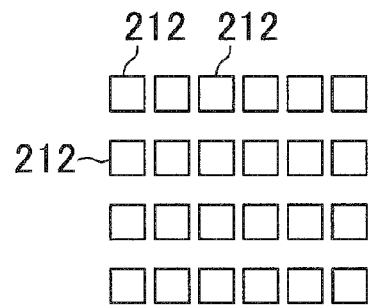
FIG. 5C
CONVENTIONAL
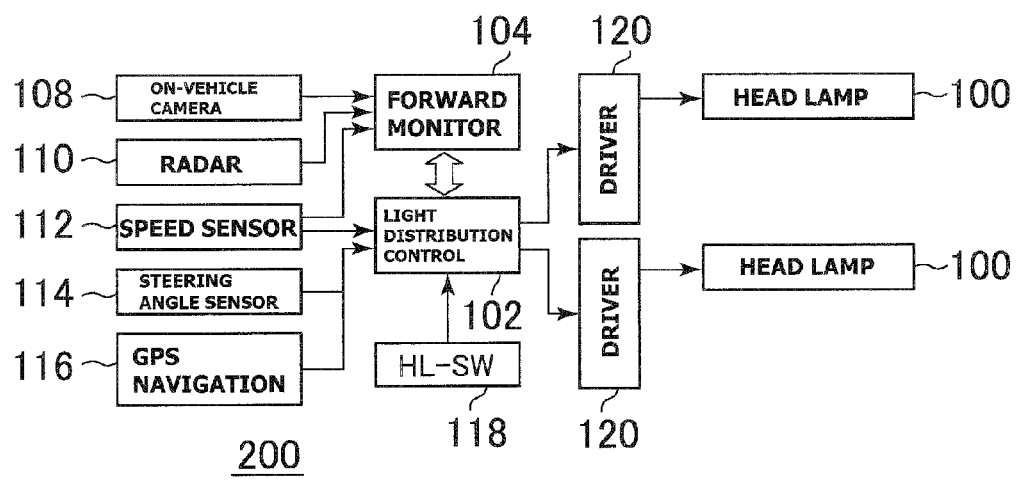

BACKGROUND

LIGHT-EMITTING DIODE APPARATUS

BACKGROUND OF THE INVENTION

Field of the Art

The present invention relates to a light-emitting diode apparatus and, particularly, to a light-emitting diode apparatus including multiple light-emitting diodes arranged in a planar light emitting region.

In recent years, regarding vehicle headlamp, technique referred to as adaptive driving beam (ADB) or the like has attracted attention. According to ADB, a light distribution shape is controlled in real time depending on conditions or circumstances in front of a vehicle, that is, whether or not there is a car in the opposite lane, a car ahead, or the like and the position thereof.

According to the technique, for example, in a case where a car in the opposite lane is detected in a driving light distribution area, that is, during driving with high beams, it is possible to reduce, in real time, beams directed toward only a region of the oncoming vehicle within a region illuminated with a headlamp. A driver has a field of view close to the high beams without interruption, whereas it is possible to prevent glare from being applied to the oncoming vehicle. In addition, a headlamp system referred to as an adaptive front-lighting system (AFS) or the like in which light distribution in a forward direction is adjusted in accordance with a steering angle of a steering wheel is becoming common.

Such headlamp system in which a light distribution is changeable can be realized, for example, by preparing a light-emitting diode apparatus in which a plurality of light-emitting diodes (LED) are arranged in an array, and the conduction/non-conduction (on/off) of the respective diodes and the drive currents (accordingly, brightness or luminance) in the on-state are controlled, in real time.

A vehicle headlamp apparatus including an array of a plurality of LED chips which are arranged in a matrix shape and can be independently controllable, and a projector lens disposed on an optical path of beams emitted from the LED chips is proposed. The vehicle headlamp apparatus can control lighting pattern of the LED chip array and thereby to form a desired light-distribution pattern in front of the vehicle (for example, refer to Japanese Unexamined Patent Application Publication No. 2013-54849).

FIG. 5A is a side view illustrating main parts of a vehicle headlamp in which a plurality of light-emitting diodes (LED) 212 are arranged in a matrix pattern on a support substrate 211 having a heat radiator structure, and a projection lens 210 is disposed in front of the LEDs 212.

FIG. 5B is a front view of a state in which the plurality of LEDs 212 are arranged in a matrix pattern. As illustrated in FIG. 5A, an optical system in which a light source formed of a plurality of LEDs disposed in a matrix pattern (hereinafter, referred to as "matrix LEDs") is directed toward the vehicle front side and a projection lens is disposed in front of the light source can project a brightness or luminance distribution pattern of the LEDs to the forward area.

FIG. 5C is a block diagram schematically illustrating a configuration of the headlamp system. A headlamp system 200 includes right and left vehicle headlamps 100, a light-distribution control unit 102, a forward monitoring unit 104, or the like. Each of the vehicle headlamps 100 has a light source formed of matrix LEDs, a projector lens, and a lamp body for accommodating the light source and the projector lens.

The forward monitoring unit 104, to which various sensors such as a vehicle camera 108, a radar 110, and a vehicle speed sensor 112 are connected, performs image processing of imaging data obtained from the sensors, detects front vehicles (oncoming vehicle and/or vehicle ahead) and/or other bright objects on the road, and division line (lane mark), and calculates data on attributes of front objects and/or positions thereof, which are required for light-distribution control. The calculated data are transmitted to the light-distribution control unit 102 and/or various onboard devices through in-vehicle LAN or the like.

The light-distribution control unit 102, to which the vehicle speed sensor 112, a steering-angle sensor 114, a GPS navigation 116, a headlamp switch 118, or the like, are connected, determines a light-distribution pattern corresponding to the driving scene. The light-distribution pattern is determined based on attributes of a bright object (oncoming vehicle, vehicle ahead, reflector, or road lighting) on the road, the position thereof (in front or at the side), and vehicle speed, which are transmitted from the forward monitoring unit 104. The light-distribution control unit 102 determines control amounts of a light distribution changeable headlamp, which is required for realizing a light-distribution pattern.

The light-distribution control unit 102 determines control details (such as lighting on/off and drive power) of each LED of the matrix LEDs. A driver 120 converts information about the control amounts from the light-distribution control unit 102 into instructions corresponding to operation of driving device or light-distribution control element and controls the operation of these components.

FIG. 6 illustrates an example of a desired light-distribution pattern. Symbol LP represents forwardly projected light-distribution pattern. Brightness or luminance distribution pattern BPh along a horizontal section is illustrated above LP and brightness or luminance distribution pattern BPv along a vertical section is illustrated on the right side of LP. In order to secure a field of view of a driver at night, it is desirable for the vehicle headlamp to have brightness distribution pattern having the greatest brightness or luminance at a light-distribution center LC and having gradually lowering brightness or luminance distribution toward the periphery in the light-distribution pattern. Normally, the light-distribution center LC has a relatively longer length in horizontal direction than a length in vertical direction. In the vehicle headlamp using a light source device having a plurality of light-emitting elements arranged in an array and individually controlling brightness of each light-emitting element, in order to realize a smooth light-distribution pattern without giving incompatibility to the driver, it is effective to reduce the size of the element and to increase the number of arranged elements. However, in this case, the number of individual elements will be increased, wiring for controlling the elements will be complicated, and the number of driving power sources should be increased.

Further, there is proposed a vehicle lighting apparatus in which a plurality of light sources such as a light source for low beams, a light source for high beams, and a light source for adjustment are combined (for example, Japanese Unexamined Patent Application Publication No. 2010-40528).

SUMMARY OF THE INVENTION

In order to realize smooth light-distribution pattern, it is preferable to increase the number of light-emitting elements arranged in a light distribution region. From another viewpoint, resolution of non-lighting pattern formed to reduce glare for a driver in an oncoming vehicle or the like in a peripheral region of the light-distribution pattern, may be lower than that in the central region of the light distribution pattern.

It is preferable to obtain a configuration in which the number of light-emitting elements is increased and wiring and control circuits are not complicated.

According to an embodiment of the present invention, there is provided a light-emitting diode apparatus comprising: a support substrate; and a light-emitting diode array formed of multiple light-emitting diodes arranged two-dimensionally on the support substrate, constituting a light distribution center having a highest brightness in the light-emitting diode array, wherein the multiple light-emitting diodes are divided into a plurality of control units, drive currents of which can be individually controlled, wherein the plurality of control units include a plurality of composite control units in each of which a plurality of light-emitting diodes are connected in series, and wherein among the plurality of light-emitting diodes in each of the composite control units, a light-emitting diode which is positioned farther from the light distribution center has a larger light-emitting area than that of a light-emitting diode which is positioned nearer from the light distribution center.

BRIEF DESCRIPTION OF THE DRAWINGS

FIGS. 5A, 5B, and 5C are a side view of main parts of a vehicle headlamp, a plan view of a light-emitting diode array, and a block diagram of a vehicle headlamp system, according to the conventional art.

DESCRIPTION OF THE PREFERRED EMBODIMENTS

Figure 1A:
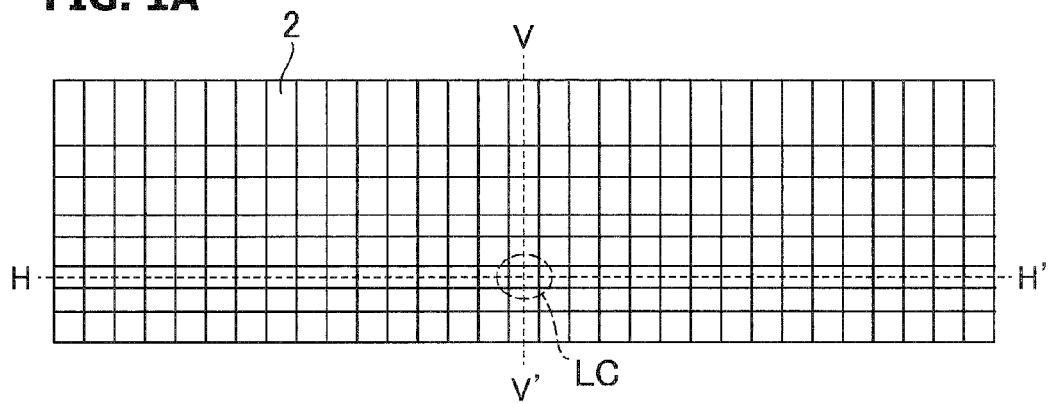
FIGS. 1A, 1B, 1C, 1D, and 1E are respectively a schematic plan view of a light-emitting diode (LED) array, an equivalent circuit diagram of eight LEDs aligned in vertical direction, a graph illustrating area ratio of these eight LEDs, an equivalent circuit diagram of LEDs arranged in eight rows and five columns, and an equivalent circuit diagram in case where the matrix LEDs are dynamically driven, according to embodiment 1.

FIGS. 1A to 1D are a schematic plan view illustrating a light-emitting diode array arranged in a matrix shape, an equivalent circuit diagram illustrating a connection of eight light-emitting diodes A to H arranged in vertical direction in FIG. 1A, a graph illustrating area ratio of the light-emitting diodes A to H, and an equivalent circuit diagram of eight rows by five columns of light-emitting diodes in a matrix, according to embodiment 1.

As illustrated in the plan view in FIG. 1A, for example, eight rows by 31 columns of light-emitting diodes 2 are arranged in matrix shape in a light-emitting region. The columns of light-emitting diodes aligned in horizontal (H-H') direction are positioned at equal pitch. On both sides of the vertical axis (V-V'), 15 columns by eight rows of light-emitting diodes are arranged in matrix shape. The respective columns are vertically divided in common, and hence the heights of the rows are common regardless of the columns. That is, the light-emitting diodes having the same shape are arranged in the row H-H' direction.

Figure 6:
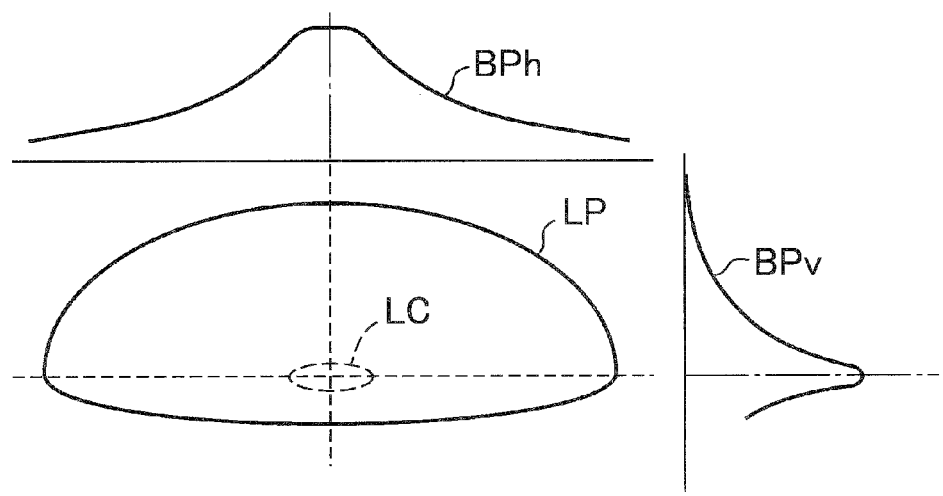
FIG. 6 illustrates a desirable light-distribution pattern within the field of view, and graphs of brightness distribution pattern in horizontal and vertical directions thereof.

The horizontal axis represented by H-H' axis in FIG. 1A constitutes brightness center axis in the horizontal direction and the vertical axis represented by V-V' axis constitutes brightness center axis in the vertical direction. It is desirable that a vehicle headlamp has brightness distribution in which brightness is greatest in front of the driver (light distribution center LC extending relatively long in the horizontal direction) and the brightness is lowered as the position approaches closer to the periphery, that is, it is desirable that the brightness distribution such as BPh illustrated on the upper side in FIG. 6 is realized along the H-H' axis, and the brightness distribution such as BPv illustrated on the right side in FIG. 6 is realized along the V-V' axis.

Figure 1B:
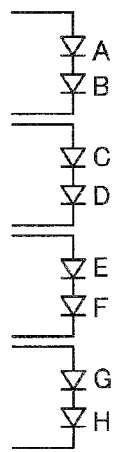

As illustrated in FIG. 1B, among the eight light-emitting diodes arranged in each column in the vertical (V-V') direction, each pair of the light-emitting diodes are connected in series, to form four control units. Current in each control unit is controlled. A control unit may include one light emitting diode, or a plurality of light emitting diodes.

Figure 1C:
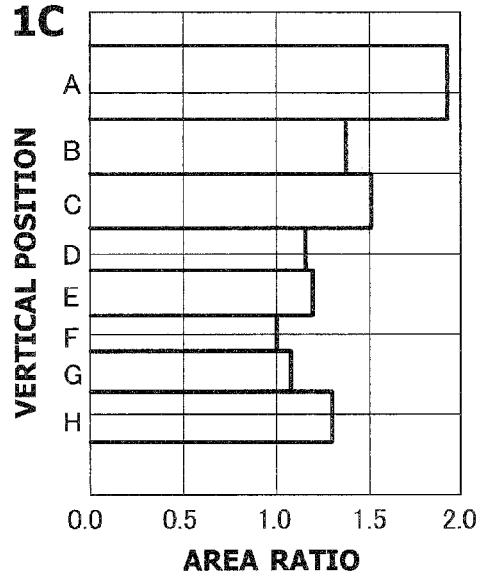

FIG. 1C illustrates area ratio of the eight light-emitting diodes in each column. Areas of two light-emitting diodes connected in series in each control unit have relationships of A>B, C>D, E>F, and H>G. That is, the light-emitting diode positioned farther from the brightness center has a larger area than that of the light-emitting diode on the brightness center side, in each control unit, to generate lower current density, and lower brightness.

Areas of the light-emitting diodes can be variously set between different control units. In FIG. 1C, the areas of the light-emitting diodes in different control units have relationships of D<E and B<C. That is, the area of a certain light-emitting diode in the control unit positioned farther from the brightness center is set to be smaller than the area of one of the light-emitting diodes in the control unit positioned closer to the brightness center. Since the light-emitting diode positioned far from the brightness center may have low brightness, the area of the light-emitting diodes in the control unit positioned far from the brightness center can be set to be smaller than the area of any one of the light-emitting diodes in the control unit positioned closer to the brightness center.

Since a current value can be individually set for each control unit, setting of an appropriate current value enables brightness distribution to be gradually lowered as the position is shifted farther from the brightness center toward the periphery in the vertical V-V' direction.

Figure 1D:
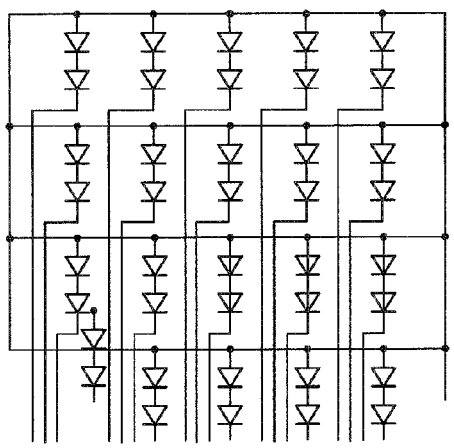

FIG. 1D illustrates an equivalent circuit of light-emitting diode arrays for five columns. Anodes of the series connections are connected in common in all the control units and cathodes are individually derived out and are connected to a power source through control circuits. Such a connection enables lighting control through control of the cathode side alone. It is also possible to connect all the cathodes in common, in place of common anodes. For example, the center of the five columns of the light-emitting diodes is the center of the field of view and is the brightness center in the horizontal direction.

When the steering angle is turned to the right by a steering wheel, it is desirable that the brightness center is shifted to the right. In the light-emitting diode array in FIG. 1A, since the light-emitting diodes having the same characteristics are aligned in the horizontal direction, a desirable brightness pattern is obtained when distribution of the drive currents at the central portion is shifted to the right. In case where the steering angle is turned to the left by a steering wheel, distribution of the drive currents at the central portion is shifted to the left.

In each control unit, the light-emitting diodes are arranged in this manner. Thereby it is possible to realize brightness or luminance gradation in which in each control unit the light emitting diode positioned farther from the light-distribution center is darker than the light emitting diode positioned closer to the light distribution center.

In each control unit, only one series connection exists, requiring one wiring outside the light-emitting diodes, and thus increase in the number of wirings is suppressed. Since the current control becomes for each control unit base, it is possible to decrease the number of the driving power sources compared to the number of brightness gradations, even when the driving power source is provided for each control unit. Further, as will be described below, it is possible to further reduce the number of the driving power sources, in case where time-division or time sharing control is performed and the plurality of control units are controlled by one driving power source.

Figure 2A:
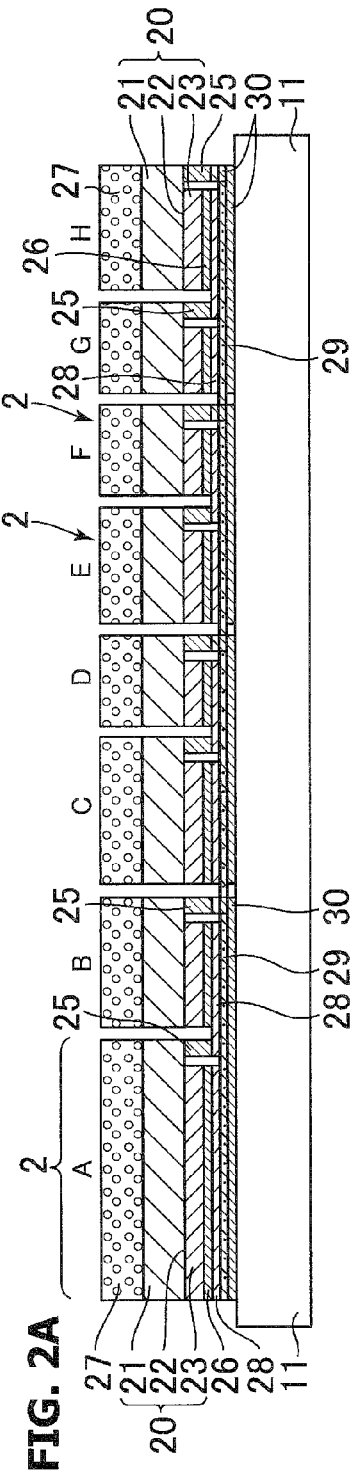
FIGS. 2A, 2B, and 2C are sectional views of three specific examples of the LED array.
Figure 2B:
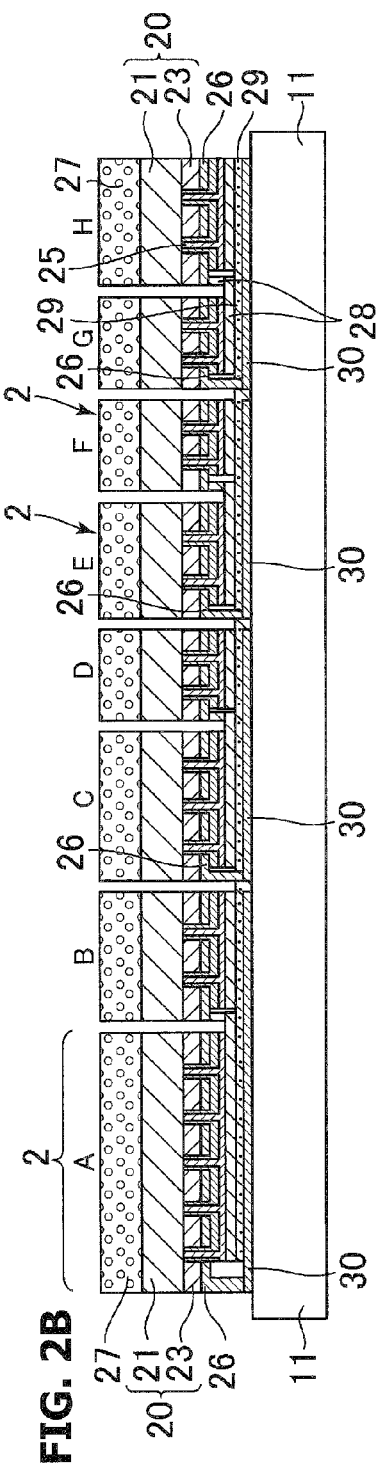
Figure 2C:
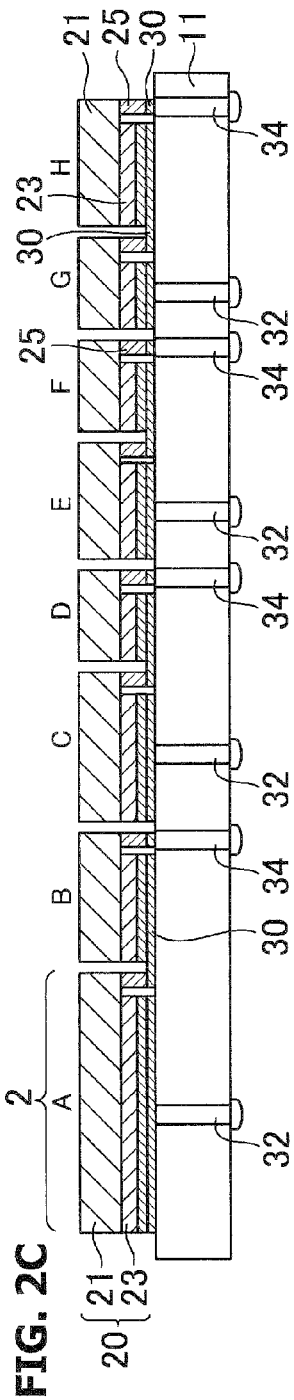

FIGS. 2A, 2B, and 2C are sectional views of specific configurations of one column of the light-emitting diode array. For example, the section along the axis V-V' in the vertical direction in FIG. 1A is illustrated.

In FIG. 2A, eight LEDs 2 are mounted on a support substrate 11 such as a silicon substrate having a surface on which an insulation layer such as a silicon oxide film is formed. The eight LEDs 2 are represented by A, B, C, D, E, F, G, and H. Each LED contains a lamination of an n-type semiconductor layer 21, a p-type semiconductor layer 23, and an active layer 22 positioned between these layers, which is not necessarily required. The active layer may be a double hetero type in a single layer or may be a multiple quantum well including barrier layers and well layers which are alternately laminated.

A p-side electrode 26 and a wiring 28 are formed on the lower surface of the p-type semiconductor layer 23 and an n-side electrode 25 is formed on the lower surface of the n-type semiconductor layer 21, where the p-type layer and the active layer are removed. The wiring 28 of the light-emitting diodes B, D, F, and H extends to the left side in the drawing and is connected to the n-side electrodes 25 of the light-emitting diodes A, C, E, and G. The n-side electrodes 25 of the light-emitting diodes B, D, F, and H are connected to a wiring 30 on the support substrate 11. An insulation layer 29 is disposed between the lamination of p-side electrodes 26/wiring 28 and the wiring 30.

The p-side electrodes 26 of light-emitting diodes A, C, E, and G are connected to equal potential node outside the drawing. Control of voltage application to the n-side electrodes 25 of the light-emitting diodes B, D, F, and H connected to the respective wiring 30 controls the lighting of each control unit.

A circuit is formed from the p-side electrode 26, through the p-type semiconductor layer 23 and the n-type semiconductor layer 21 to the n-side electrode 25 in the left-side diode of a set of two LEDs, and through the wiring 28 another circuit is formed from the p-side electrode 26 to the n-side electrode 25 and the wiring 30 in the right-side diode, thus forming a series connection of the two LEDs. The equivalent circuit illustrated in FIG. 1B is formed by similar series connections.

A phosphor layer 27 is formed on the n-type semiconductor layer 21 disposed on the upper side. For example, in case where the LED is a blue LED containing GaN, phosphors such as YAG which generates yellow light, or the like, are coupled to generate white light.

In a configuration in FIG. 2A, one end of the p-type semiconductor layer 23 is removed and the n-side electrode 25 is formed on the exposed n-type semiconductor layer 21. Current is unlikely to be supplied to a semiconductor layer separated far from the n-side electrode 25, and a region from which the p-type semiconductor layer 23 is removed, becomes a region which is supplied with a current but which can not emit light.

FIG. 2B illustrates a configuration of a via electrode type which can improve this point. A plurality of via-holes are formed in the p-type semiconductor layer 23 and the insulation layer is formed on a side wall. The n-side electrodes 25 are embedded in the via-holes. It is easier to supply current to the entire n-type layer from the plurality of via electrodes. Since the n-side electrodes 25 are distributed, noticeable shadow is unlikely to be formed.

In this case, the n-side electrodes 25 of the light-emitting diodes B, D, F, and H are connected to equal potential node at a position outside the drawing, application of a voltage to the p-side electrodes 26 of the light-emitting diodes A, C, E, and G connected to the respective wirings 30 is controlled to control lighting of the respective control units.

In FIGS. 2A and 2B, circuit is formed using multi-layer wiring on the support substrate. Through (penetration) electrodes can also be formed in the support substrate. In FIG. 2C, after through-holes are formed in the support substrate 11 and insulating process is performed, electrodes are embedded in the through-holes, to form through (penetration) electrodes 32 and 34. Other processes can be performed in similar manner as those in FIGS. 2A and 2B. In FIG. 2C, a phosphor layer is not illustrated. It is, however, provided in similar manner as in FIGS. 2A and 2B. Similar to FIG. 2A, the p-side electrodes 26 of A, C, E, and G are connected to an equal potential node at a position outside the drawing. Power sources are individually wired to the n-side electrodes 25 of B, D, F, and H. Control of voltage application to individual n-type electrodes controls the lighting of each control unit.

Brightness or luminance adjustment of each control unit is performed by application of pulse waveform which is subjected to modulation control to be described below, through wiring which is individually connected to the n-side electrodes 25 in the case of FIGS. 2A and 2C and to the p-side electrodes 26 in the case of FIG. 2B.

Static driving of each LED may be performed in a period of lighting, but the number of wires and the number of power sources will be increased. It is possible to employ dynamic drive in which the plurality of control units are driven with time-division or time sharing control. When the light-emitting diode array disposed in a matrix shape is dynamically driven by dividing the array in time in the horizontal direction, it is possible to significantly decrease the number of the control circuits and the power sources. It is possible to perform the time-division or time sharing control in the vertical direction.

Figure 1E:
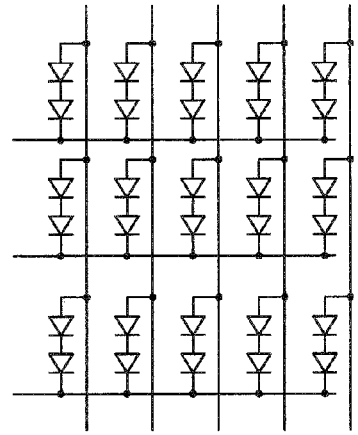

FIG. 1E represents wiring in case of performing dynamic driving. The cathodes of respective control units aligned in respective rows are connected to equal potential and the anodes of the respective control units aligned in respective columns are connected at equal potential. In this case, for example, voltage is applied to the respective rows in time-shared or time-division manner (for example, in a period of 25%), and the respective columns are superposed with the pulse waveform subjected to modulation control to be described below, to control lighting and brightness adjustment of each control unit.

Figure 3A:
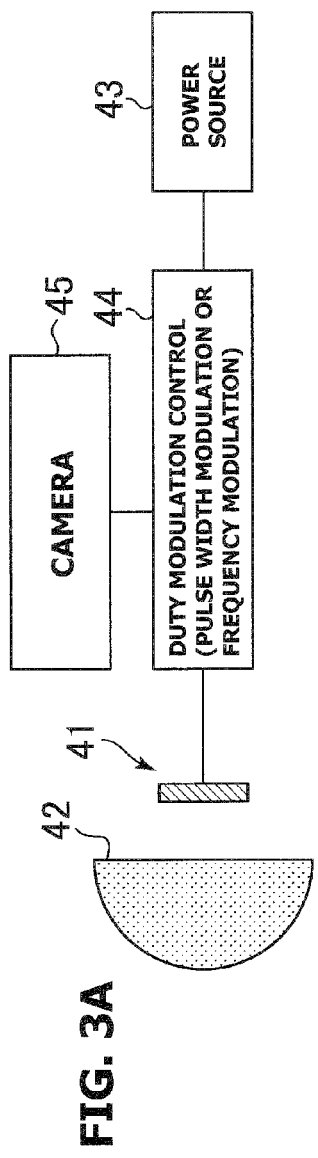
FIG. 3A is a block diagram schematically illustrating a configuration of a vehicle headlamp apparatus using the light-emitting diode array according to the embodiment.

FIG. 3A is a block diagram schematically illustrating a configuration of a vehicle headlamp apparatus using the light-emitting diode array according to the embodiment. A lens unit 42 is disposed in front of a light-emitting diode array 41 and irradiates light emitted from the light-emitting diode array toward the front. When the light-emitting diode array is disposed at a position forwardly shifted from the focal point of the lens unit 42, diffused light is emitted, respective light emission regions in the array are overlapped with one another, and a shadow portion becomes not noticeable.

A power source unit 43 supplies through a duty modulation control unit 44 a drive current subjected to modulation control to the light-emitting diode array. A camera unit 45 takes an image of the front side of the vehicle and supplies information about an oncoming vehicle, a vehicle ahead, or the like, to the duty modulation control unit 44. The duty modulation control unit 44 performs modulation control driving by pulse-width modulation or frequency modulation and performs a light emission prevention process with respect to a particular direction.

Figure 3B:
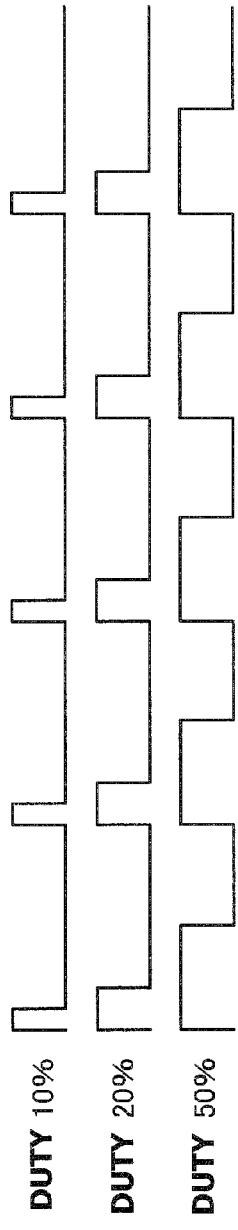
FIGS. 3B and 3C are graphs illustrating shapes of drive waveforms of pulse-width modulation and frequency modulation, respectively.

FIG. 3B illustrates change in drive waveform by pulse-width modulation, drive waveforms at duty of 10%, 20%, and 50%. The pulse width is modulated. The light-emitting diode is driven at a timing (once in four cycles) when the pulse-width modulated voltage application overlaps with the time-divided row voltage application.

Figure 3C:
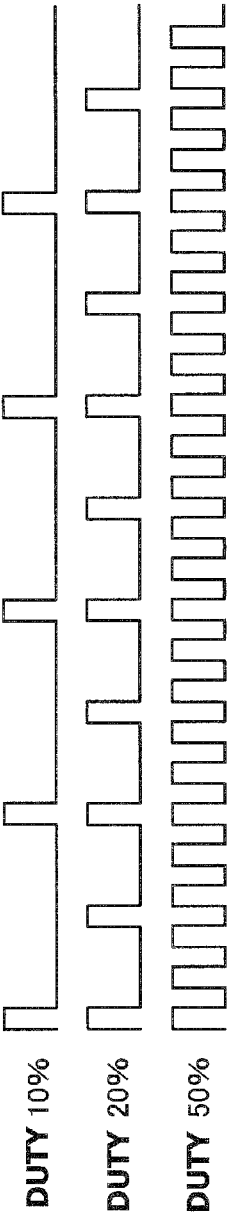

FIG. 3C illustrates change in drive waveform by frequency modulation, drive waveforms at duty of 10%, 20%, and 50%. The number of pulses within a fixed period is modulated. In this case also, the light-emitting diode is driven at a timing when the frequency modulated voltage application overlaps with the time-divided row voltage application.

Description has been made on the case where the eight rows by 31 columns of LEDs arranged in a matrix configure control units, in each of which two LEDs adjacent in a column direction are connected in series. However, connection in a matrix and the total shape of the matrix can be variously selected. Hereinafter, modifications of the matrix will be described.

Figure 4A:
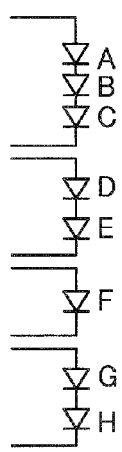
FIGS. 4A and 4B are equivalent circuit diagrams and FIGS. 4C, 4D, 4E, and 4F are plan views, all of which illustrate modifications of the embodiment.

FIG. 4A illustrates a case where the eight LEDs in the column direction configure control units with three LEDs A, B, and C, two LEDs D and E, one LED F, and two LEDs G and H, respectively. Far field is irradiated with three LEDs A, B and C connected in series. Among the control units which may include one light emitting diode or a plurality of light emitting diodes, those including a plurality of light emitting diodes are called composite control units. Control units described before FIG. 4A are composite control units.

Figure 4B:
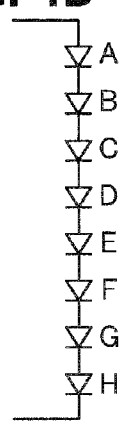

FIG. 4B illustrates a case where the eight LEDs in the column direction are connected in series in one control unit. The brightness distribution in the vertical direction can be formed; however, on/off control is performed in column unit. As will be described below, in a case where low beams and high beams have separate light sources, control unit of this type can be used in the high beam devices.

Figure 4C:
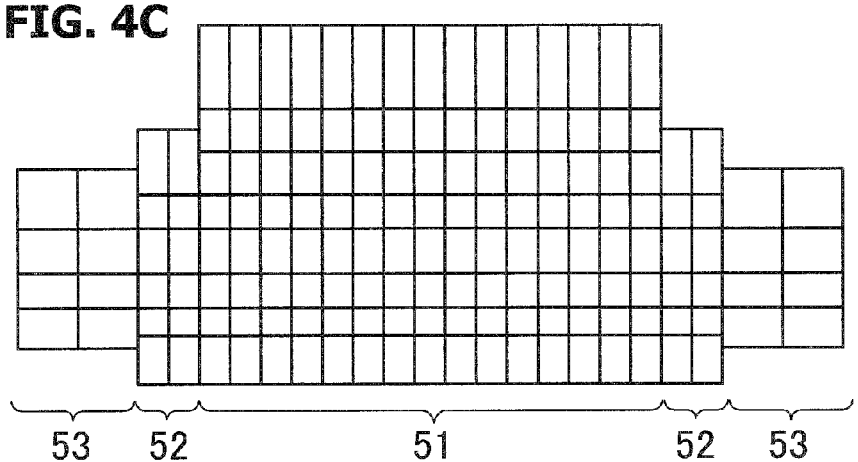

FIG. 4C illustrates a case in which a matrix configuration is changed, in the central portion 51, in the intermediate portions 52 on both sides of the central portion, and in the end portions 53 on the outer sides of the intermediate portions. The number of rows of the respective units is reduced as the position approaches the ends. The column width of the respective portions is changed.

Figure 4D:
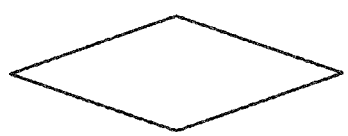

The shape of the entire light-emitting diode array is not limited to a rectangle or combination thereof. It is possible to employ a rhombus illustrated in FIG. 4D, or to employ an ellipse (a rectangle in which corners are rounded) illustrated in FIG. 4E, or the like.

Figure 4F:
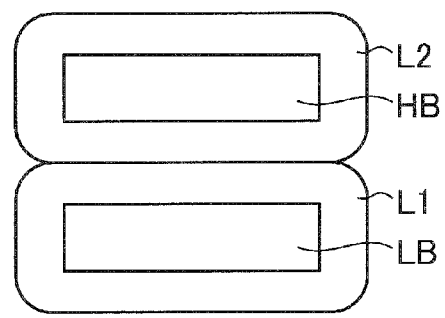
Figure 4E:

FIG. 4F illustrates a headlamp including an LED array LB for the low beams, which is combined with a projector lens L1, and an LED array HB for the high beams, which is combined with a projector lens L2. The low beams may have fixed patterns, and the embodiment described above can be applied to the LED array HB for the high beams.

As above, the invention is described based on the examples. Basic concepts will be confirmed. The multiple LEDs are arranged in two-dimensional pattern or in matrix shape to form light emission region of a desired area. In case of the vehicle headlamp, a desirable light distribution pattern has brightness that is gradually decreased from the light distribution center toward the periphery. The multiple LEDs are divided into the plurality of control units. One or a plurality of LEDs are included in one control unit. In the control unit including a plurality of LEDs (which is called composite control unit), the plurality of LEDs are connected in series and is driven by a common current. For example, in a case where one control unit includes two LEDs which are connected in series, it is possible to decrease by half the number of signal lines to be controlled and the number of drive power sources.

Adjustment of relative areas of the LEDs connected in series controls relative brightness of light emission among the LEDs. The plurality of LEDs, which are connected in series in one control unit, and have different light-emitting areas, have different current density, and thereby the LEDs have different brightness of luminance. The LEDs connected in series in such a manner that the light-distribution center has the greatest brightness and brightness distribution gradually lowers toward the periphery.

For shifting the light distribution center to the right or left, it is preferable that the light-emitting diode matrix has a constant pitch in the horizontal (traverse) direction. In this case, adjustment of the brightness in the control unit, i.e. area change of the light-emitting diode, will be done by dimension change in vertical direction.

Description has been made on the embodiments. However, the invention is not limited thereto. For example, the light-emitting diode (LED) may be a semiconductor laser. Since the semiconductor laser is a diode, LED is a concept including laser. It is obvious for those skilled in the art that other various modifications, changes, combinations, or the like, can be performed.

What we claim are:

1. A light-emitting diode apparatus comprising:
   a support substrate; and
   a light-emitting diode array formed of multiple light-emitting diodes arranged in a two-dimensional matrix shape on the support substrate, the light-emitting diode array having a light distribution center having a highest brightness in the light-emitting diode array,
   wherein the multiple light-emitting diodes are divided into a plurality of control units, drive currents of which can be individually controlled,
   wherein the plurality of control units include a plurality of composite control units in each of which a plurality of light-emitting diodes are connected in series, and the plurality of composite control units include a first composite control unit and a second composite control unit disposed nearer to the light distribution center than the first composite control unit, wherein among the plurality of light-emitting diodes in each of the composite control units, a light-emitting diode which is positioned farther from the light distribution center has a larger light-emitting area than that of a light-emitting diode which is positioned nearer to the light distribution center, wherein the first composite control unit includes an outer first light emitting diode and an inner first light emitting diode, and the second composite control unit includes an outer second light emitting diode and an inner second light emitting diode, wherein the outer first light emitting diode, the inner first light emitting diode, the outer second light emitting diode and the inner second light emitting diode are aligned along a same direction, and wherein the inner first light emitting diode has a smaller area than that of the outer second light emitting diode.

2. The light-emitting diode apparatus according to claim 1, wherein the light distribution center extends in a lateral direction and the plurality of light-emitting diodes connected in series in each of the composite control units are aligned in a vertical direction crossing the extending direction of the light distribution center.

3. The light-emitting diode apparatus according to claim 2, further comprising:
 a lens unit disposed in front of the light-emitting diode array on a light emitting side,
 wherein the light-emitting diode apparatus constitutes a lighting apparatus for use in a vehicle.

4. The light-emitting diode apparatus according to claim 3, further comprising:
 a camera unit that monitors an area in front of the vehicle; and
 a control circuit that controls drive signals for the plurality of control units based on a signal from the camera unit, wherein the light-emitting diode apparatus constitutes a head-light for use in the vehicle.

5. The light-emitting diode apparatus according to claim 2, wherein the matrix shape has rows in the lateral direction and columns in the vertical direction, and the columns have a same width in the lateral direction.

6. The light-emitting diode apparatus according to claim 1, wherein control units constituting a row forming the light-distribution center include one light-emitting diode in each of the control units.

7. The light-emitting diode apparatus according to claim 1, wherein each of the multiple light-emitting diodes has a phosphor layer and emits white light, and the light-emitting diode apparatus constitutes a headlamp for use in a vehicle.

8. The light-emitting diode apparatus according to claim 1, further comprising:
 driving power source for providing controlled drive current for the respective control units.

9. The light-emitting diode apparatus according to claim 8, wherein the driving power source performs static driving for the plurality of control units.

10. The light-emitting diode apparatus according to claim 8, wherein the driving power source performs time sharing driving in a vertical direction in field of view.

11. The light-emitting diode apparatus according to claim 8, wherein the driving power source performs pulse-width modulation or frequency modulation.

12. A light-emitting diode apparatus comprising:
 a support substrate; and
 a light-emitting diode array formed of multiple light-emitting diodes arranged two-dimensionally on the support substrate, the light-emitting diode array having a light distribution center having a highest brightness in the light-emitting diode array,
 wherein the multiple light-emitting diodes are divided into a plurality of control units, drive currents of which can be individually controlled,
 wherein the plurality of control units include a plurality of composite control units in each of which a plurality of light-emitting diodes are connected in series,
 wherein among the plurality of light-emitting diodes in each of the composite control units, a light-emitting diode which is positioned farther from the light distribution center has a larger light-emitting area than that of a light-emitting diode which is positioned nearer to the light distribution center,
 wherein the light distribution center extends in a first direction, and the plurality of light-emitting diodes connected in series in each of the composite control units are aligned in a direction crossing the extending direction of the light distribution center,
 wherein the light-emitting diode apparatus further comprises:
  a lens unit disposed in front of the light-emitting diode array on a light emitting side, wherein the light-emitting diode apparatus constitutes a lighting apparatus for use in a vehicle;
  a camera unit that monitors an area in front of the vehicle; and
  a control circuit that controls drive signals for the plurality of control units based on a signal from the camera unit, wherein the light-emitting diode apparatus constitutes a head-light for use in the vehicle, and
 wherein the plurality of control units are arranged in a matrix shape, one of terminals of the control units in each row are commonly connected, and the control circuit controls currents supplied to the other terminals of the respective control units.

13. A light-emitting diode apparatus comprising:
 a support substrate; and
 a light-emitting diode array formed of multiple light-emitting diodes arranged two-dimensionally on the support substrate, the light-emitting diode array having a light distribution center having a highest brightness in the light-emitting diode array,
 wherein the multiple light-emitting diodes are divided into a plurality of control units, drive currents of which can be individually controlled,
 wherein the plurality of control units include a plurality of composite control units in each of which a plurality of light-emitting diodes are connected in series,
 wherein among the plurality of light-emitting diodes in each of the composite control units, a light-emitting diode which is positioned farther from the light distribution center has a larger light-emitting area than that of a light-emitting diode which is positioned nearer to the light distribution center,
 wherein the light distribution center extends in a first direction, and the plurality of light-emitting diodes connected in series in each of the composite control units are aligned in a direction crossing the extending direction of the light distribution center,
 wherein the light-emitting diode apparatus further comprises:

a lens unit disposed in front of the light-emitting diode array on a light emitting side, wherein the light-emitting diode apparatus constitutes a lighting apparatus for use in a vehicle;

a camera unit that monitors an area in front of the vehicle; and a control circuit that controls drive signals for the plurality of control units based on a signal from the camera unit, wherein the light-emitting diode apparatus constitutes a head-light for use in the vehicle, and wherein the plurality of control units are arranged in a matrix shape, one of terminals of the control units in each column are commonly connected, and the other terminals of the control units in each row are commonly connected.

14. The light-emitting diode apparatus according to claim 13, wherein the matrix of the control units is dynamically driven.

* * * * *